United States Patent
Steiner et al.

(10) Patent No.: US 12,404,034 B2
(45) Date of Patent: Sep. 2, 2025

(54) POWER ELECTRONICS SYSTEM, ELECTRICAL SYSTEM, AND PROPULSION SYSTEM FOR A VEHICLE SUCH AS AN AIRCRAFT

(71) Applicant: Airbus (S.A.S.), Blagnac (FR)

(72) Inventors: Gerhard Steiner, Mindelheim (DE); Florian Kapaun, Kirchseeon (DE)

(73) Assignee: Airbus (S.A.S.), Blagnac (FR)

( * ) Notice: Subject to any disclaimer, the term of this patent is extended or adjusted under 35 U.S.C. 154(b) by 283 days.

(21) Appl. No.: 18/203,235

(22) Filed: May 30, 2023

(65) Prior Publication Data
US 2023/0391466 A1 Dec. 7, 2023

(30) Foreign Application Priority Data
Jun. 2, 2022 (EP) ..................... 22176892

(51) Int. Cl.
| | |
|---|---|
| *H05K 7/20* | (2006.01) |
| *B64D 37/00* | (2006.01) |
| *B64D 37/30* | (2006.01) |
| *B64D 41/00* | (2006.01) |
| *F25B 19/00* | (2006.01) |

(52) U.S. Cl.
CPC ........... *B64D 37/005* (2013.01); *B64D 37/30* (2013.01); *H05K 7/20372* (2013.01); *B64D 2041/005* (2013.01); *B64D 2221/00* (2013.01); *F25B 19/005* (2013.01)

(58) Field of Classification Search
CPC ........... H05K 7/20372; H05K 7/20945; H05K 7/20936; F25B 19/005
See application file for complete search history.

(56) References Cited

U.S. PATENT DOCUMENTS

| | | | |
|---|---|---|---|
| 8,959,941 B2* | 2/2015 | Campbell | H05K 7/20781 361/679.52 |
| 10,165,707 B1* | 12/2018 | Christiansen | H05K 7/20872 |
| 10,595,441 B1* | 3/2020 | Christiansen | H05K 7/20509 |
| 10,736,236 B2* | 8/2020 | Engelhardt | H05K 7/2039 |
| 10,852,789 B1* | 12/2020 | Bender | G06F 1/20 |
| 2019/0010866 A1* | 1/2019 | Snyder | H02K 11/33 |
| 2019/0014687 A1* | 1/2019 | Snyder | F02K 3/115 |

FOREIGN PATENT DOCUMENTS

CN 106016764 A 10/2016

OTHER PUBLICATIONS

European Search Report for U.S. Appl. No. 22/176,892 dated Nov. 25, 2022.

* cited by examiner

Primary Examiner — Filip Zec
(74) Attorney, Agent, or Firm — KDW Firm PLLC

(57) ABSTRACT

Use of cryogenic fuel tanks for the cooling of power electronics circuits to improve cooling capabilities for power electronics in vehicles or an aircraft. The power electronics circuit can be cooled via a cryogenic cooling loop by the fuel directly, or the fuel is used to cool a separated coolant tank. A control valve controls the coolant flow within the cryogenic cooling loop based on an electrical property of the power switching element of the power electronics circuit and or based on the way the power switching elements are electrically connected together. The control valve can control the coolant flow such that a junction temperature is achieved which minimizes the drain-source resistance.

15 Claims, 2 Drawing Sheets

POWER ELECTRONICS SYSTEM, ELECTRICAL SYSTEM, AND PROPULSION SYSTEM FOR A VEHICLE SUCH AS AN AIRCRAFT

TECHNICAL FIELD

The disclosure herein relates to power electronics. Furthermore, the disclosure herein relates to electrical systems and propulsion systems of a vehicle, such as an aircraft.

BACKGROUND

Recently, in view of environmental concerns, concepts for zero emission aircraft have been discussed and proposed more sincerely. One particular candidate for realizing this concept is the use of cryogenic liquid hydrogen (LH2) as a fuel. The LH2 is either directly used in adapted jet engines or converted into electrical energy by high-power fuel cells (mostly in the form of solid oxide fuel cells SOFCS). In either case the number of systems on aircraft that are electrical in nature and require specialized power electronics is increasing. Thus, there is a need in the industry to improve integration of power electronics and specifically to improve cooling of these systems.

SUMMARY

It is an object of the disclosure herein to improve cooling capabilities for power electronics in vehicles, preferably in aircraft.

The object is achieved by the subject-matter disclosed herein. Preferred embodiments are disclosed herein.

The disclosure herein provides a power electronics system for controlling and supplying an electrical load with electrical energy, the power electronics system comprising:
- a power electronics circuit configured to control and supply the electrical load with electrical energy from an energy source, the power electronics circuit having at least one power switching element;
- a cryogenic cooling loop configured for cooling the power electronics circuit, the cryogenic cooling loop having a control valve configured for controlling coolant flow within the cryogenic cooling loop; and
- a controller configured for controlling the control valve based on at least one electrical property of the power switching element and/or based on the way power switching elements are electrically connected together.

Preferably, the controller is configured to control the control valve based on the electrical property of drain-source resistance of each power switching element such that the drain-source resistance is reduced or minimized.

Preferably, the controller is configured to control the control valve based on the electrical properties of drain-source resistance and temperature coefficient behavior of each power switching element such that the drain-source resistance is reduced or minimized.

Preferably, the controller is configured to control the control valve based on the electrical property of power loss caused by each power switching element.

Preferably, the controller is configured to determine the power loss as the sum of on-state and switching losses of each power switching element.

Preferably, the at least two power switching elements are electrically connected in parallel.

Preferably, the cryogenic cooling loop comprises a heat exchanger that is in thermal contact with the power electronics circuit.

Preferably, the control valve is arranged to control the coolant flow to the heat exchanger.

Preferably, the cryogenic cooling loop comprises a coolant tank that is configured to store a liquefied coolant at cryogenic temperatures below 100 K, preferably at temperatures below 80 K, more preferably at temperatures below 20 K, and the coolant tank is fluidly connected to the heat exchanger, preferably via the control valve.

Preferably, the cooling loop comprises a return line that fluidly connects to the heat exchanger and is configured to transport coolant away therefrom, preferably to the coolant tank.

The disclosure herein provides an electrical system for a vehicle, preferably for an aircraft, the system comprising:
- a fuel tank configured for storing liquefied fuel at cryogenic temperatures below 100 K;
- a fuel cell apparatus that is fluidly connected to the fuel tank and configured to directly generate electrical energy from the fuel;
- an electrical load that is configured to consume the electrical energy; and
- a preferred power electronics system that is arranged to control the electrical energy going towards the electrical load.

Preferably, the fuel tank is arranged in thermal contact with the cryogenic cooling loop, preferably with the coolant tank, or wherein the fuel tank forms part of the cryogenic cooling loop as its coolant tank.

The disclosure herein provides a propulsion system for a vehicle, preferably an aircraft, the system comprising a preferred electrical, and an engine that is arranged for propulsion of the vehicle.

Preferably, the engine is an electrical engine that forms the electrical load.

Preferably, the engine is a jet-type engine that consumes fuel from the fuel tank.

The idea is based in the field of cryogenic power electronics (PE). In this case this means using power electronic devices at very low temperatures from −150° C. down to −200° C. or even less. Due to the fact that some (e.g. GaN) power semiconductors improve their properties (losses are decreasing) when cooled down to very low temperatures, cryogenic PE is one of the enablers of full electric aircraft. This technology is useful for almost every high power system that has to deliver highest power density with lowest weight and volume.

According to one idea the described approach helps to improve efficiency and additionally may allow the use of all semiconductor technologies instead of only those which have a constant PTC behavior over temperature (this is particularly important when multiple semiconductors have to be put in parallel for the same switch).

The idea takes advantage of the temperature dependence of power semiconductors. According to Applicant's investigations the lowest temperature does not have to be automatically the optimal point of operation. Especially for SiC (silicon carbide) MOSFETs the temperature dependency seems to change at temperatures below −100° C. from a positive temperature coefficient (PTC) to a negative temperature coefficient (NTC). The ideas disclosed herein allows that SiC dies can be put in parallel even below that threshold temperature.

The optimal point of operation can be chosen (also for the complete system approach) and all kinds of semiconductor technologies can be used. Due to this, the overall system can be optimized, power density can be increased, and weight and volume may be decreased. These are key factors for the electrification of aircraft.

In one embodiment a power electronics setup with an actively controlled cryogenic cooling loop is proposed. The cooling loop allows to keep the junction of the used power semiconductors at a nearly constant level. Normally, power modules are mounted on some kind of heatsink to get rid of their losses. This approach can also be transferred to the cryogenic sector. By variation of the flow rate in the cooling loop, the heat transfer can be actively controlled. If the heat transfer is reduced, the junction temperature rises and vice versa.

In another embodiment the actual load conditions are considered. To obtain the desired junction temperature, the latter can be measured or calculated in real time based on a model.

The temperature of the dies can be chosen in various ways. In one embodiment, the efficiency of the semiconductors can be improved by controlling the temperature such that a decrease in the drain-source resistance, when switched on ($R_{DS,on}$) is caused.

In another embodiment the semiconductors are arranged in parallel. The temperature is controlled such that the semiconductors show a PTC behavior. The temperature may simultaneously be controlled to reduce the $R_{DS,on}$ under the precondition that the semiconductors show a PTC behavior.

In another embodiment, the temperature is controlled such that a decrease of the overall losses (sum of on-state and switching losses) is achieved.

In another embodiment the overall system efficiency may be optimized. In another embodiment a tradeoff between lower temperature ($R_{DS,on}$) and cooling effort may be used, as the cooling effort may strongly increase when the temperature goes down to cryogenic temperatures.

With the discloses ideas, the junction temperature in cryogenic power electronic systems may be actively controlled. This allows for a higher performance. Also the system's weight and volume may be lowered. The reliability of the system may improve, in particular due to a reduction in thermal cycling. The ideas are compatible with a wide variety of semiconductor materials and are also promising for SiC technology. The cooling effort may be reduced due to the cold source being preferably on the circuit board.

BRIEF DESCRIPTION OF THE DRAWINGS

Embodiments of the disclosure herein are described in more detail with reference to the accompanying schematic drawings that are listed below

DETAILED DESCRIPTION

Figure 1:
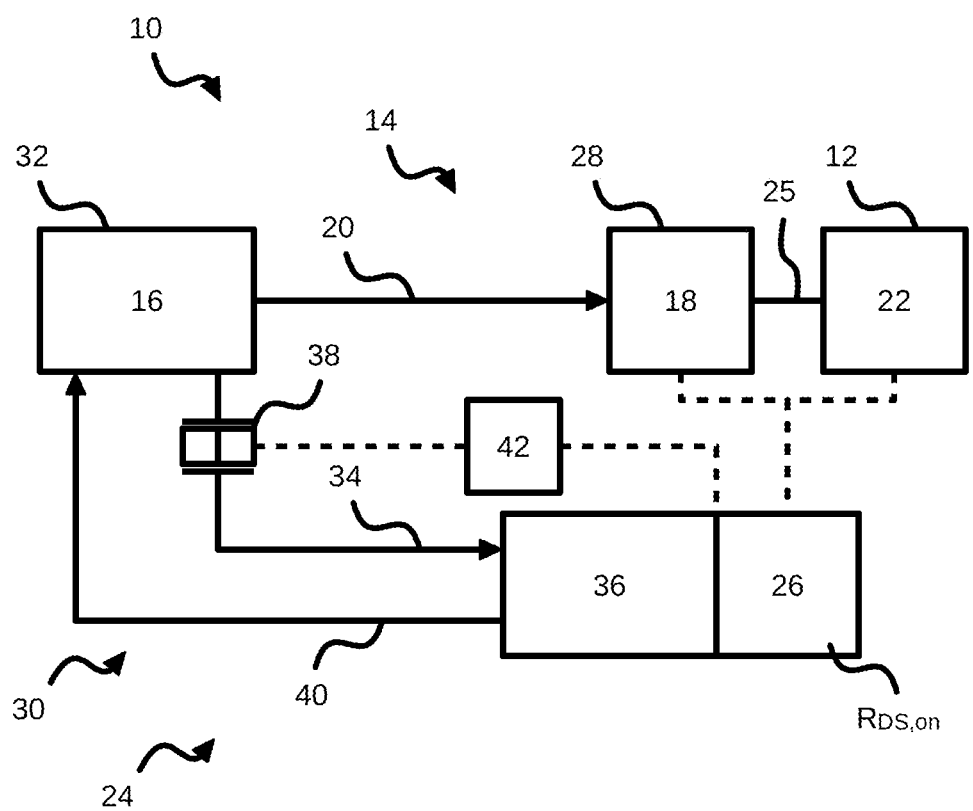
FIG. 1 depicts a first embodiment of a propulsion system.

Referring to FIG. 1 a propulsion system 10 for an aircraft is depicted. The propulsion system 10 comprises an electrical engine 12. The electrical engine 12 drives a fan or a propeller for propelling the aircraft.

The propulsion system 10 comprises an electrical system 14. The electrical system 14 includes a fuel tank 16. The fuel tank 16 is configured for storing liquefied fuel at cryogenic temperatures below 100 K. The fuel may be liquid hydrogen (LH2), for example. In a variant that is not depicted the electrical engine 12 is replaced with a jet-like combustion engine that may use the fuel directly.

The electrical system 14 includes a fuel cell apparatus 18. The fuel cell apparatus 18 is configured to convert the fuel (e.g. LH2) directly into electrical energy. The fuel cell apparatus 18 is fluidly connected to the fuel tank 16 by a feed line 20. The fuel cell apparatus 18 may include a plurality of fuel cell stacks that are preferably of the solid oxide type.

The electrical system 14 includes an electrical load 22 that is supplied with the electrical energy that is generated by the fuel cell apparatus 18 via a supply line 25. The electrical load 22 may include the electrical engine 12. The electrical load 22 may include other components such as energy storage, heating apparatus, or generally any other electrical load that warrants the employment of power electronics.

The electrical system 14 includes a power electronics system 24. The power electronics system 24 comprises a power electronics circuit 26. The power electronics circuit 26 is configured to control the electrical load 22. The power electronics circuit 26 is configured to supply the electrical load 22 with electric energy from an energy source 28. The energy source 28 may be formed by the fuel cell apparatus 18, for example.

The power electronics circuit 26 includes at least one power switching element. The power switching element may be a MOSFET, preferably a SiC-MOSFET. Depending on the power needs of the electrical load 22, two or more power switching elements may be electrically connected in parallel.

The power electronics system 24 includes a cryogenic cooling loop 30. The cryogenic cooling loop 30 includes a coolant tank 32 that can store cryogenic liquefied coolant, such as LH2 or liquid nitrogen (LN2). The coolant tank 32 may be formed by the fuel tank 16.

The cooling loop 30 includes a coolant feed line 34 that fluidly connects the coolant tank 32 to a heat exchanger 36. The heat exchanger 36 may be configured as a typical heat exchanger. In some embodiments, the power electronics circuit 26, especially the power switching elements, may be immersed directly in the cryogenic coolant.

The cooling loop 30 includes a control valve 38. The control valve 38 is arranged in the coolant feed line 34 between the coolant tank 30 and the heat exchanger 36. The control valve 38 is configured to control the coolant flow from the coolant tank 30 to the heat exchanger 36.

The cooling loop 30 includes a coolant return line 40 that transports the coolant from the heat exchanger 36 back to the coolant tank 30.

The power electronics system 24 includes a controller 42. The controller 42 is connected to at least one temperature sensor that is arranged on the power electronics circuit 26 for measuring a temperature value that is indicative of the junction temperature of the power switching element(s).

The controller 42 may furthermore be configured to measure electrical properties of the power switching elements, such as their drain-source resistance. The controller 42 furthermore is connected to the control valve 38 so as to control the coolant flow and keep the junction temperature at a desired value.

The controller 42 is configured to maintain the junction temperature at a value that minimizes the drain-source resistance $R_{DS,on}$ of the power switching element. In case of multiple power switching elements, the total or average drain-source resistance of the power switching elements may be minimized.

The controller 42 may alternatively or additionally be configured to maintain the junction temperature at a value such that the power switching elements exhibit a PTC behavior. The controller 42 may simultaneously minimize the $R_{DS,on}$ with the added condition that the power switching elements exhibit a PTC behavior.

The controller 42 may alternatively or additionally be configured to measure electrical properties of the power switching elements that are indicative of the on-state and the switching losses. The controller 42 may then maintain the junction temperature at a value that minimizes the total on-state and switching losses.

In this embodiment, the fuel acts simultaneously as the coolant and is fed from the fuel tank 16 to the fuel cell apparatus 18. The fuel cell apparatus 18 converts the fuel into electrical energy to be supplied to the electrical load 22. The fuel cell apparatus 18 and the electrical load 22 are controlled with the power electronics system 24.

In addition, the power electronics system 24 uses the fuel from the fuel tank 16 to cool the power electronics circuit 26, specifically the junction temperature of the power switching elements, by controlling the coolant flow with a control valve 38. The junction temperature is determined by the controller 42 which in turn controls the control valve 38 such that the junction temperature is at a value that is predetermined by one or more goals.

Figure 2:
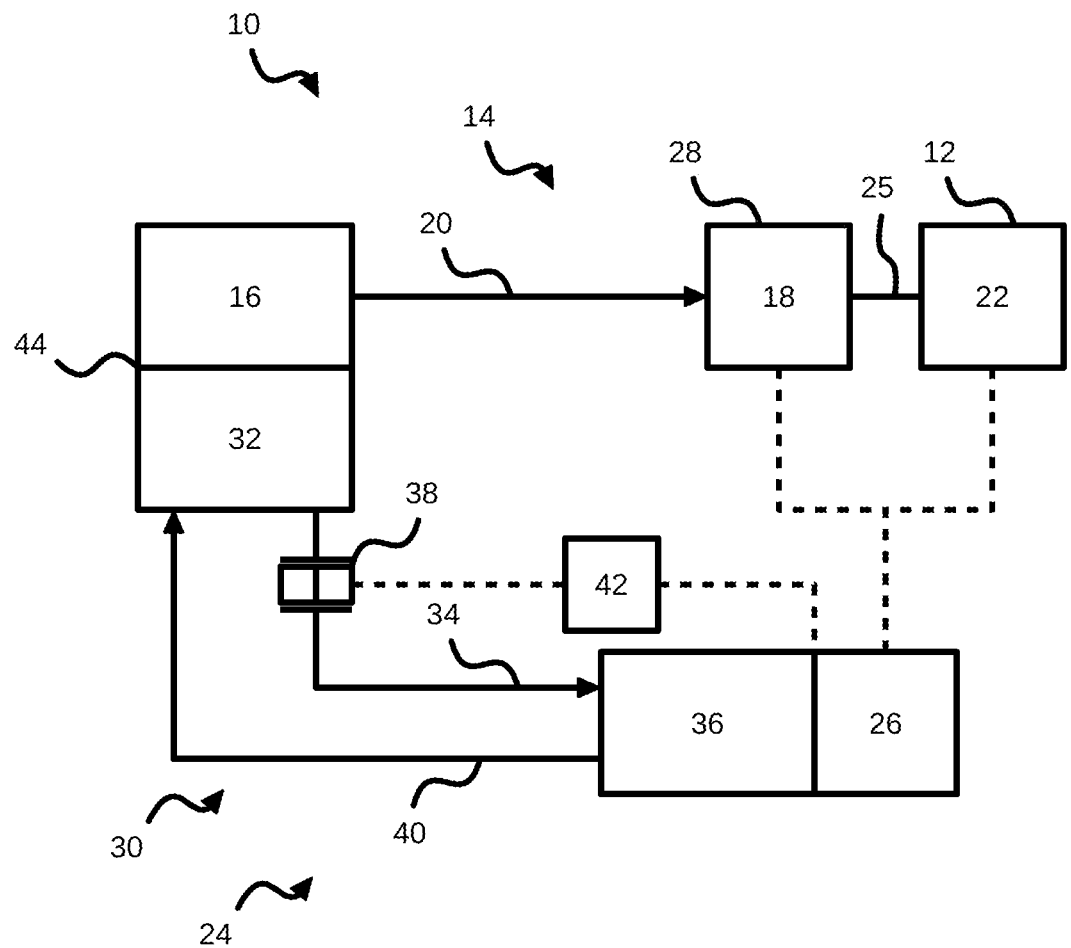
FIG. 2 depicts a second embodiment of a propulsion system.

Referring to FIG. 2 a second embodiment of the propulsion system 10 is described only insofar as it differs from the first embodiment.

Here, the fuel tank 16 and the coolant tank 32 are separate from each other. The fuel tank 16 may include LH2, whereas the coolant tank 32 includes LN2. The power electronics system 24 includes a second heat exchanger 44 that is in thermal contact with the fuel tank 16.

In this embodiment, the fuel and the coolant are in separate fluid lines. The fuel cell apparatus 18 converts the fuel from the fuel tank 16 into electrical energy to be supplied to the electrical load 22. The fuel cell apparatus 18 and the electrical load 22 are controlled with the power electronics system 24.

The power electronics system 24 uses the coolant from the coolant tank 30 to cool the power electronics circuit 26, specifically the junction temperature of the power switching elements, by controlling the coolant flow with a control valve 38. The coolant is kept at a useful temperature by exchanging heat with the fuel in the fuel tank 16 via the second heat exchanger 44. The junction temperature is determined by the controller 42 which in turn controls the control valve 38 such that the junction temperature is at a value that is predetermined by one or more goals.

In order to improve cooling capabilities for power electronics in vehicles, preferably in aircraft, the disclosure herein proposes to use the cryogenic fuel tanks in the cooling of power electronics circuits. The power electronics circuit may be cooled via a cryogenic cooling loop by the fuel directly, or the fuel is used to cool a separated coolant tank. A control valve controls the coolant flow within the cryogenic cooling loop based on an electrical property of the power switching element of the power electronics circuit and/or based on the way the power switching elements are electrically connected together. For example, the control valve controls the coolant flow such that a junction temperature is achieved which minimizes the drain-source resistance ($R_{DS,on}$).

LIST OF REFERENCE SIGNS 10 propulsion system
12 electrical engine
14 electrical system
16 fuel tank
18 fuel cell apparatus
20 feed line
22 electrical load
24 power electronics system
25 supply line
26 power electronics circuit
28 energy source
30 cryogenic cooling loop
32 coolant tank
34 coolant feed line
36 heat exchanger
38 control valve
40 coolant return line
42 controller
44 second heat exchanger
$R_{DS,on}$ drain-source resistance While at least one example embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A power electronics system for controlling and supplying an electrical load with electrical energy, the power electronics system comprising:
    a power electronics circuit configured to control and supply the electrical load with electrical energy from an energy source, the power electronics circuit having at least one power switching element;
    a cryogenic cooling loop configured for cooling the power electronics circuit the cryogenic cooling loop having a control valve configured for controlling coolant flow within the cryogenic cooling loop; and
    a controller configured for controlling the control valve based on at least one electrical property of the power switching element and or based on how power switching elements are electrically connected together.

2. The power electronics system according to claim 1, wherein the controller is configured to control the control valve based on an electrical property of drain-source resistance of each power switching element such that the drain-source resistance is reduced or minimized.

3. The power electronics system according to claim 1, wherein the controller is configured to control the control valve based on electrical properties of drain-source resistance and temperature coefficient behavior of each power switching element such that the drain-source resistance is reduced or minimized.

4. The power electronics system according to claim 1, wherein the controller is configured to control the control valve based on an electrical property of power loss caused by each power switching element.

5. The power electronics system according to claim 4, wherein the controller is configured to determine the power loss as a sum of on-state and switching losses of each power switching element.

6. The power electronics system according to claim 1, wherein the at least two power switching elements are electrically connected in parallel.

7. The power electronics system according to claim 1, wherein the cryogenic cooling loop comprises a heat exchanger in thermal contact with the power electronics circuit.

8. The power electronics system according to claim 7, wherein the control valve is arranged to control the coolant flow to the heat exchanger.

9. The power electronics system according to claim 7, wherein the cryogenic cooling loop comprises a coolant tank configured to store a liquefied coolant at cryogenic temperatures below 100 K, or at temperatures below 80 K, or at temperatures below 20 K, and the coolant tank is fluidly connected to the heat exchanger or fluidly connected to the heat exchanger via the control valve.

10. The power electronics system according to claim 7, wherein the cooling loop comprises a return line that fluidly connects to the heat exchanger and is configured to transport coolant away therefrom to the coolant tank.

11. An electrical system for a vehicle or an aircraft, the system comprising:
   a fuel tank configured for storing liquefied fuel at cryogenic temperatures below 100 K;
   a fuel cell apparatus fluidly connected to the fuel tank and configured to directly generate electrical energy from the fuel;
   an electrical load configured to consume the electrical energy; and
   a power electronics system according to claim 1 that is configured to control the electrical energy going towards the electrical load.

12. The electrical system according to claim 11, wherein the fuel tank is in thermal contact with the cryogenic cooling loop, or with the coolant tank, or wherein the fuel tank forms part of the cryogenic cooling loop as its coolant tank.

13. A propulsion system for a vehicle or an aircraft, the system comprising an electrical system according to claim 11, and an engine configured for propulsion of the vehicle.

14. The propulsion system according to claim 13, wherein the engine is an electrical engine that forms the electrical load.

15. The propulsion system according to claim 13, wherein the engine is a jet-type engine that consumes fuel from the fuel tank.

* * * * *